(12) United States Patent
Chen et al.

(10) Patent No.: US 8,823,032 B2
(45) Date of Patent: Sep. 2, 2014

(54) LIGHT-EMITTING DIODE ELEMENT, METHOD FOR MANUFACTURING LIGHT GUIDE STRUCTURE THEREOF AND EQUIPMENT FOR FORMING THE SAME

(75) Inventors: Chun-Ting Chen, Bade (TW); Wei-Chih Shen, Tainan (TW); Li-Wen Lai, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 111 days.

(21) Appl. No.: 13/604,245

(22) Filed: Sep. 5, 2012

(65) Prior Publication Data

US 2013/0126924 A1    May 23, 2013

(30) Foreign Application Priority Data

Nov. 23, 2011    (TW) .............................. 100142979 A

(51) Int. Cl.
| | |
|---|---|
| *H01L 33/00* | (2010.01) |
| *H01L 21/00* | (2006.01) |
| *H01L 33/22* | (2010.01) |
| *H01L 33/20* | (2010.01) |

(52) U.S. Cl.
CPC ................. *H01L 33/22* (2013.01); *H01L 33/20* (2013.01); *H01L 2933/0091* (2013.01)
USPC .................... 257/98; 438/27; 438/29; 438/39; 438/40

(58) Field of Classification Search
CPC ............ H01L 33/22; H01L 2933/0083; H01L 51/5262; H01L 31/02327; H01L 2933/0091; H01L 31/0236; G02B 6/0038; G02B 6/0018; G02B 6/0061; G02B 6/0046; G02B 5/0221; G02B 5/0231; G02B 6/0015
USPC ............. 257/98, E33.005, E33.006, E33.043, 257/79, 81, 84; 438/27, 29, 39, 40
See application file for complete search history.

(56) References Cited

U.S. PATENT DOCUMENTS

| | | | |
|---|---|---|---|
| 7,419,912 | B2 | 9/2008 | Donofrio |
| 7,492,091 | B2 | 2/2009 | Kharrazi-Olsson et al. |
| 7,563,695 | B2 | 7/2009 | Gu et al. |
| 7,749,782 | B1 | 7/2010 | Knollenberg et al. |
| 7,952,115 | B2 | 5/2011 | Loh et al. |

(Continued)

FOREIGN PATENT DOCUMENTS

| | | |
|---|---|---|
| CN | 1808199 | 7/2006 |
| CN | 1978982 | 6/2007 |

(Continued)

OTHER PUBLICATIONS

TW Office Action dated Dec. 13, 2013.

(Continued)

*Primary Examiner* — Julio J Maldonado
*Assistant Examiner* — Cory Eskridge
(74) *Attorney, Agent, or Firm* — McClure, Qualey & Rodack, LLP

(57) ABSTRACT

A light-emitting diode (LED) element is provided. The LED element includes a substrate, a diode structure layer and several light-guide structures. The light-guide structures are formed on at least one of the substrate and the diode structure layer. Each light-guide structure has an inner sidewall, and several spiral slits formed on the inner side wall.

12 Claims, 13 Drawing Sheets

(56) References Cited

U.S. PATENT DOCUMENTS

| | | | |
|---|---|---|---|
| 7,956,368 B2 | 6/2011 | Nagai et al. | |
| 2003/0132445 A1* | 7/2003 | Yoshitake et al. | 257/84 |
| 2010/0019263 A1 | 1/2010 | Yeh et al. | |
| 2010/0151602 A1* | 6/2010 | Knollenberg et al. | 438/29 |
| 2010/0193813 A1* | 8/2010 | Kao et al. | 257/98 |

FOREIGN PATENT DOCUMENTS

| | | |
|---|---|---|
| TW | 200603235 A | 1/2006 |
| TW | 200625701 A | 7/2006 |
| TW | 200818555 | 4/2008 |
| TW | 200919773 A | 5/2009 |
| TW | 201122708 | 7/2011 |

OTHER PUBLICATIONS

English language translation of abstract of CN 1808199 (published Jul. 26, 2006).

English language translation of abstract of CN 1978982 (published Jun. 13, 2007).

English language translation of abstract of TW 200818555 (published Apr. 16, 2008).

English language translation of abstract of TW 201122708 (published Jul. 1, 2011).

Hsieh, M.Y., et al.; "Improvement of External Extraction Efficiency in GaN-Based LEDs by SiO2 Nanosphere Lithography;" IEEE Electron Device Letters; vol. 29; No. 7; Jul. 2008; pp. 658-660.

Huang, H.W., et al.; "Enhanced Light Output from a Nitride-Based Power Chip of Green Light-Emitting Diodes with Nano-Rough Surface Using Nanoimprint Lithography;" Nanotechnology 19; 2008; pp. 1-4.

Huh, C., et al; "Improved Light-Output and Electrical Performance of InGaN-Based Light-Emitting Diode by Microroughening of the p-GaN Surface;" Journal of Applied Physics; vol. 93; No. 11; Jun. 2003; pp. 9383-9385.

Huang, H.W., et al.; "Enhanced Light Output of an InGaN/GaN Light Emitting Diode with a Nano-Roughened p-GaN Surface;" Nanotechnology 16; 2005; pp. 1844-1848.

* cited by examiner

LIGHT-EMITTING DIODE ELEMENT, METHOD FOR MANUFACTURING LIGHT GUIDE STRUCTURE THEREOF AND EQUIPMENT FOR FORMING THE SAME

This application claims the benefit of Taiwan application Serial No. 100142979, filed Nov. 23, 2011, the disclosure of which is incorporated by reference herein in its entirety.

BACKGROUND

1. Technical Field

The disclosed embodiments relate to a light-emitting diode (LED) element, a manufacturing method of a light-guide structure thereof and an equipment of forming the light-guide structure thereof.

2. Description of the Related Art

Accompanied with gradual global resource depletion and ever-increasing environment-friendly awareness, green energy is now a highly valued subject. Among various types of green energy, the light-emitting diode (LED) and solar cell are considered as a mainstream in the green energy industry, and have matured with time. Compared to a conventional fluorescent lamp, the LED is free from mercury pollutions, and is at the same time advantaged by being light and small in size and power-saving as well as having a long lifespan. Moreover, ratios of materials forming the LED can be adjusted to change an emission color of the LED to diversified colors including red, blue, yellow and white to offer even more versatile applications. Therefore, apart from being utilized as a replacement for the fluorescent lamp, the LED may also serve as backlight sources of a monitor display to enhance performance and reduce a size of a display. In current white-light solid-state lighting, an indium gallium nitride (InGaN) LED playing a crucial role is particularly in demand. Therefore, it is an important topic as how to effectively increase light-emitting efficiency of the InGaN LED.

As the LED is targeted at being high in light intensity and high in efficiency, a first issue to overcome is element thermal effects that reduce external quantum efficiency (EQE) of an LED element. When an induced current increases, electric energy is reflected as thermal energy due to lowered optoelectronic conversion efficiency, such that the thermal energy is accumulated inside the element to reduce not only reliability but also lifespan of the element. Therefore, it is a focus of the industry to how to increase LED light-emitting efficiency to solve LED heat dissipation. Generally speaking, to increase LED light-emitting efficiency, a coarse surface is usually formed on a semiconductor layer through ablation when manufacturing the semiconductor layer.

However, a focusing process is needed to ablate a material so that energy is increased to a damage threshold to further achieve processing effects. The above process is yet quite time-consuming, and hence a laser manufacturing process is inapplicable to the optoelectronic semiconductor or manufacturing processes of other industries.

SUMMARY

The disclosure is directed to a light-emitting diode (LED) element, a method for manufacturing a light-guide structure thereof and equipment for forming a light-guide structure thereof.

According to one embodiment, an LED element is provided. The LED element includes a substrate, a diode structure layer and a plurality of light-guide structures. The diode structure layer is formed on the substrate. The light-guide structures are formed on at least one of the substrate and the diode structure layer. Each of the light-guide structures has an inner sidewall, and several spiral slits formed on the inner side wall.

According to another embodiment, a method for manufacturing a light-structure of an LED element is provided. The method includes: providing a substrate; forming a diode structure layer on the substrate; disposing the substrate on a forming equipment, the forming equipment including a laser source, a focusing lens structure and a wave plate, the wave plate being disposed between the laser light source and the focusing lens; and transmitting a laser beam by the laser source, the laser beam entering at least one of the substrate and the diode structure layer after passing through the wave plate and the focusing lens structure to form a plurality of light-guide structures. Each of the light-guide structures has an inner sidewall and a plurality of spiral slits, with the slits being formed on the inner sidewall.

According to another alternative embodiment, forming equipment applied to an LED element is provided. The forming equipment includes a laser source, a focusing lens structure and a wave plate. The wave plate is disposed between the laser source and the focusing lens structure. The laser source transmits a laser beam, which enters the LED element after passing through the wave plate and the focusing lens structure to form a plurality of light-guide structures.

Figure 1:
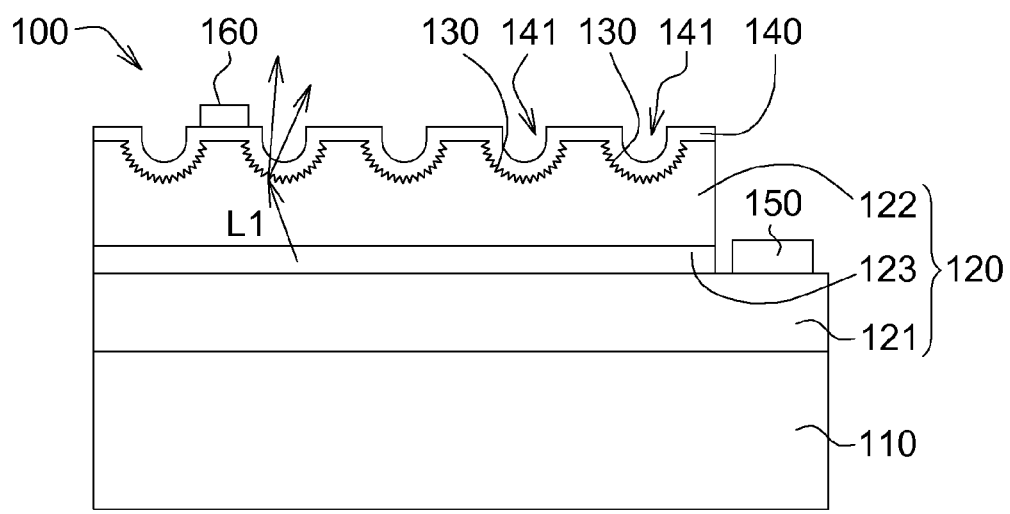
FIG. 1 is a sectional view of an LED element according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 is a sectional view of a light-emitting diode (LED) element according to an embodiment.

An LED element 100 includes a substrate 110, a diode structure layer 120 and a plurality of light-guide structures 130.

For example, the substrate 110 is an optoelectronic material made of or doped with silicon, gallium nitride (GaN), aluminum nitride (AlN), aluminum gallium nitride (AlGaN), indium gallium nitride (InGaN), silicon carbide (SiC), zinc oxide (ZnO), magnesium zinc oxide (MgZnO), or an optoelectronic material made of indium tin oxide (ITO) and/or sapphire.

Referring to FIG. 1, the diode structure layer 120 is formed on the substrate 110, and includes a first semiconductor layer 121, a second semiconductor layer 122 and an active layer 123.

The first semiconductor layer 121 is formed on the substrate 110. The first semiconductor layer 121 is either a P-type semiconductor or an N-type semiconductor; the second semiconductor layer 122 is the other of the P-type semiconductor or the N-type semiconductor relative to the first semiconductor layer 121. For example, the P-type semiconductor and the N-type semiconductor are made of GaN. The active layer 123 is formed between the first semiconductor layer 121 and the second semiconductor layer 122. For example, the active layer 123 is made of a multi-quantum well structure.

When a beam L1 generated by the diode structure layer 120 enters the light-guide structures 130, the light-guide structures 130 diffuse the beam L1 to a light-exiting side of the LED element 100. Through the light-guide structures 130, a probability of a total reflection of beam L1 transmitted from the diode structure layer 120 is effectively reduced to further enhance light extraction efficiency of the LED element 100.

As shown in FIG. 1, the LED element 100 further includes a transparent electrode 140, e.g., ITO, formed on the diode structure layer 120. More specifically, the transparent electrode 140 covers the second semiconductor 122. The transparent electrode 140 includes a plurality of recesses 141 formed in adaption to a contour of the light-guide structures 130.

Through the light-guide structures 130, photons transmitted from the active layer 123 to the second semiconductor layer 122 are not only capable of lowering a loss in a critical angle of the total reflection at the second semiconductor layer 122 and the transparent electrode 140, but also effectively maximize external quantum efficiency of the LED element 100.

Referring to FIG. 1, the LED element 100 further includes a first electrode 150 and a second electrode 160. The first electrode 150 is electrically connected to the first semiconductor layer 121 and serves as an input/output (IO) contact of the first semiconductor 121. The second electrode 160 is electrically connected to the second semiconductor layer 122 and serves as an IO contact of the second semiconductor 122. The second electrode 160 is formed on the transparent electrode 140, and is electrically connected to the second semiconductor layer 122 via the transparent electrode 140. For example, the first electrode 150 and the second electrode 160 is made of a metal, such as gold, chromium and/or silver.

Figure 2:
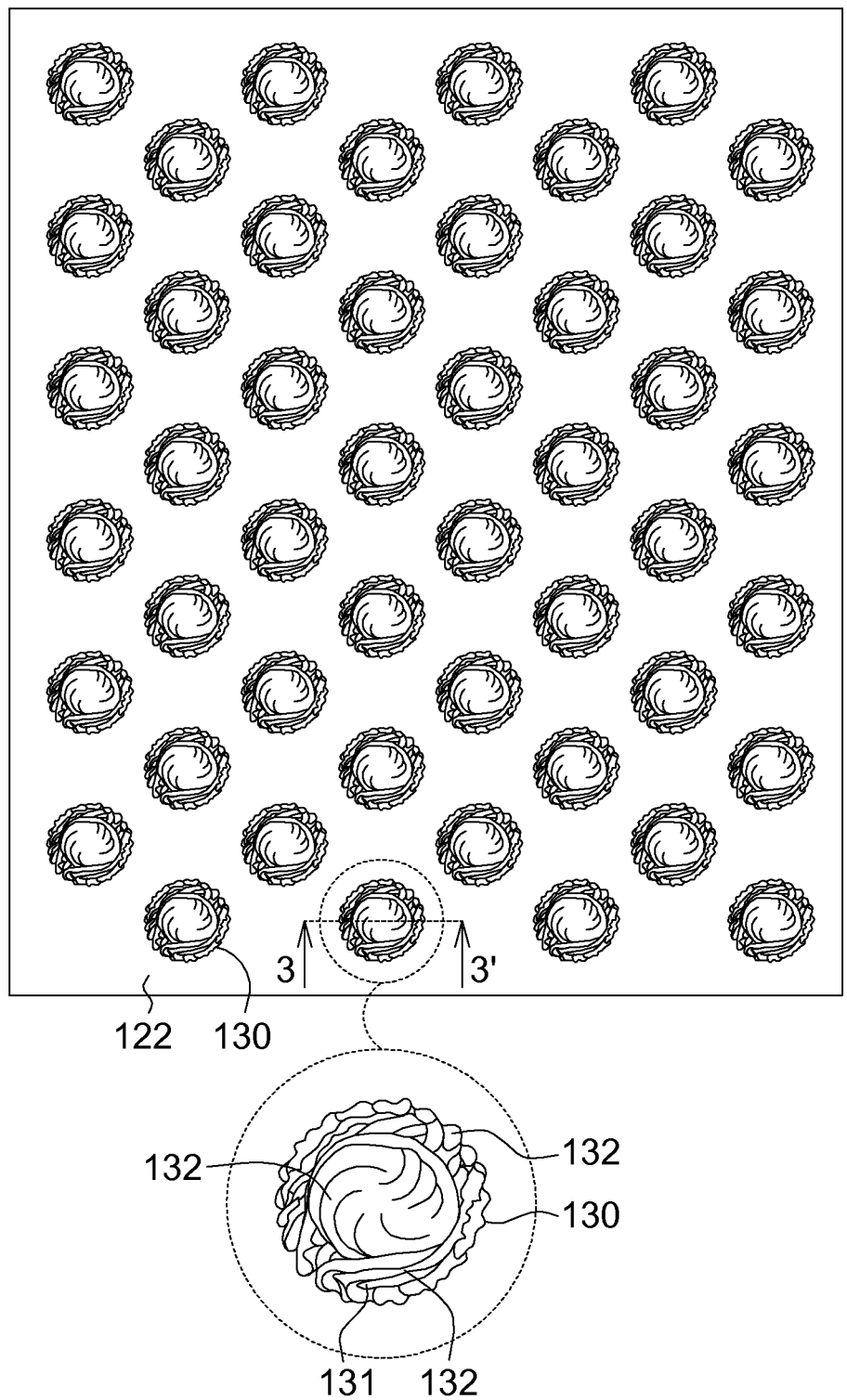
FIG. 2 is a top view of FIG. 1.
Figure 3:
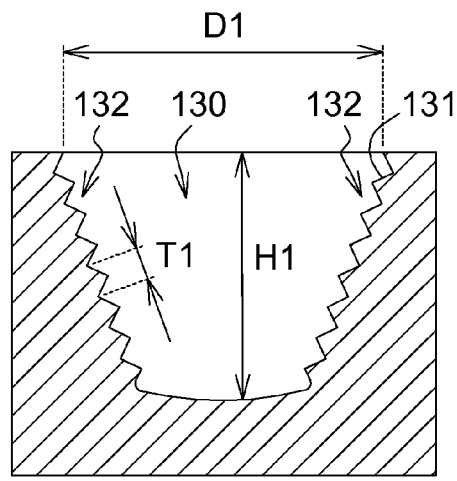
FIG. 3 is a sectional view along a direction 3-3' in FIG. 2.

FIG. 2 is a top view of FIG. 1; FIG. 3 is a sectional view along 3-3' in FIG. 2.

In this embodiment the light-guide structures 130 are formed on the second semiconductor layer 122. For example, each of the light-guide structures 130 is a recess having an inner sidewall 131 and a plurality of spiral slits 132. The spiral slits 132 are formed on the inner sidewall 131. Although not depicted in FIGS. 2 and 3, the transparent electrode 140 may be formed on the inner sidewalls 131 and the spiral slits 132.

As shown in FIG. 2, lengths of the spiral slits 132 are different, i.e., some spiral slits 132 have a shorter length whereas others have a longer length. Under an appropriately controlled manufacturing process, the lengths of the spiral slits 132 are controlled to be approximate to one another or to be variable within a tolerable range.

Figure 9:
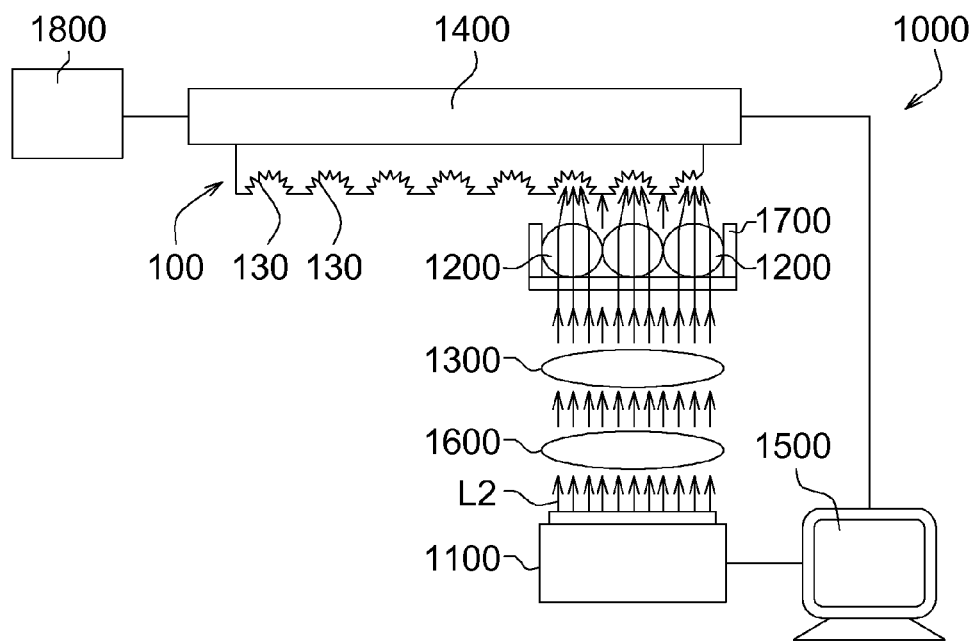
FIG. 9 is a schematic diagram of equipment for forming light-guide structures of an LED element according to one embodiment.

As shown in FIG. 3, each of the light-guide structures 130 has an opening diameter D1 between 0.25 μm and 500 μm, and a depth H1 between 10 nm and 1000 nm. The opening diameter D1 and the depth H1 of the light-guide structures 130 may be determined by emission time and energy of a laser beam L2 (FIG. 9).

The spiral slits 132 may be in a regular or irregularly arrangement. Regardless whether the spiral slits 132 are in a regular or irregular arrangement, the spiral slits 132 are capable of diffusing the beam L1 to a light-exiting side of the LED element 100.

As shown in FIG. 3, geometric sizes of the spiral slits 132 may be different. In another embodiment, through a controlled laser process, the spiral slits 132 having the same geometric sizes may be obtained. It should be noted that this embodiment does not limit the geometric sizes of the spiral slits 132.

As shown in FIG. 3, a period of the spiral slits 132 approximately ranges between 50 nm and 1000 nm. More specifically, a gap T1 between two neighboring spiral slits 132 is approximately between 50 nm and 1000 nm.

In the above embodiment, an example of the light-guide structures 130 formed on the second semiconductor layer 122 is described. However, in other embodiments, the light-guide structures 130 may be formed on at least one of the substrate 110, the first semiconductor layer 121, the second semiconductor layer 122, the active layer 123 and the transparent electrode 140. Details shall be given for illustrating some of the examples above.

Figure 4:
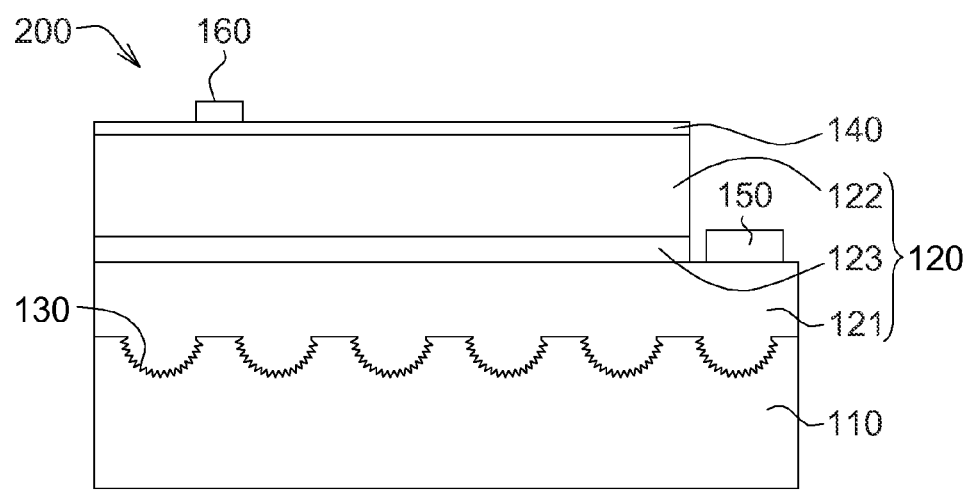
FIG. 4 is a sectional view of an LED element according to another embodiment.

FIG. 4 is a sectional view of an LED element according to another embodiment. An LED element 200 includes a substrate 110, a diode structure layer 120, a plurality of light-guide structures 130, a transparent electrode 140, a first electrode 150 and a second electrode 160. In this embodiment, the light-guide structures 130 are formed on the substrate 110. The diode structure layer 120 covers the light-guide structures 130, e.g., filling recesses of the light-guide structures 130.

Figure 5:
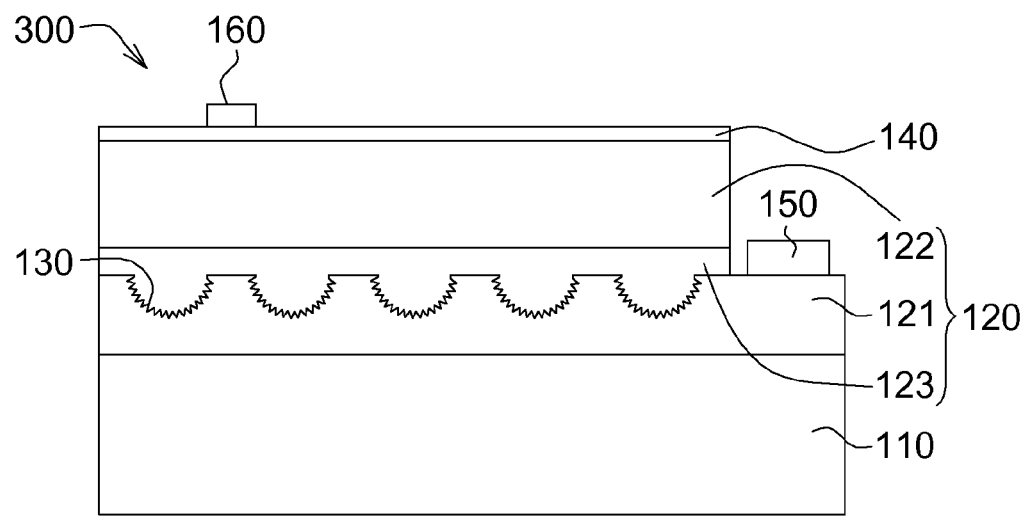
FIG. 5 is a sectional view of an LED element according to another embodiment.

FIG. 5 is a sectional view of an LED element according to an alternative embodiment. An LED element 300 includes a substrate 110, a diode structure layer 120, a plurality of light-guide structures 130, a transparent electrode 140, a first electrode 150 and a second electrode 160. In this embodiment, the light-guide structures 130 are formed in a first semiconductor layer 121 of the diode structure layer 120, and an active layer 123 of the diode structure layer 120 covers the light-guide structures 130, e.g., filling recesses of the light-guide structures 130.

Figure 6:
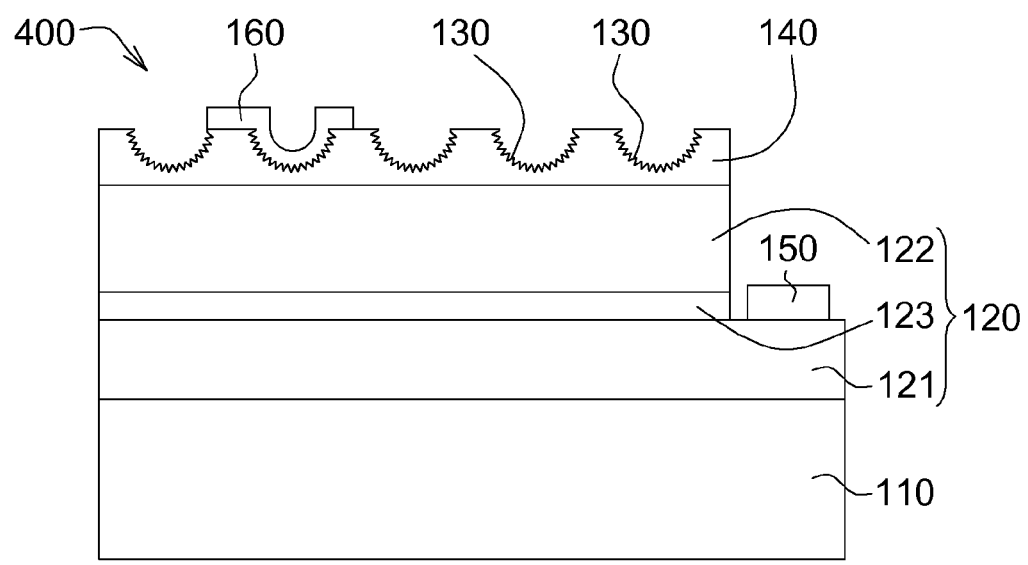
FIG. 6 is a sectional view of an LED element according to another embodiment.

FIG. 6 is a sectional view of an LED element according to an embodiment. An LED element 400 includes a substrate 110, a diode structure layer 120, a plurality of light-guide structures 130, a transparent electrode 140, a first electrode 150 and a second electrode 160. In this embodiment, the light-guide structures 130 are formed in the transparent electrode 140 on the diode structure layer 120. The second electrode 160 covers the light-guide structures 130, e.g., partially filling recesses of the light-guide structures 130. In another embodiment, the second electrode 160 fills entire recesses of the light-guide structures 130.

Figure 7:
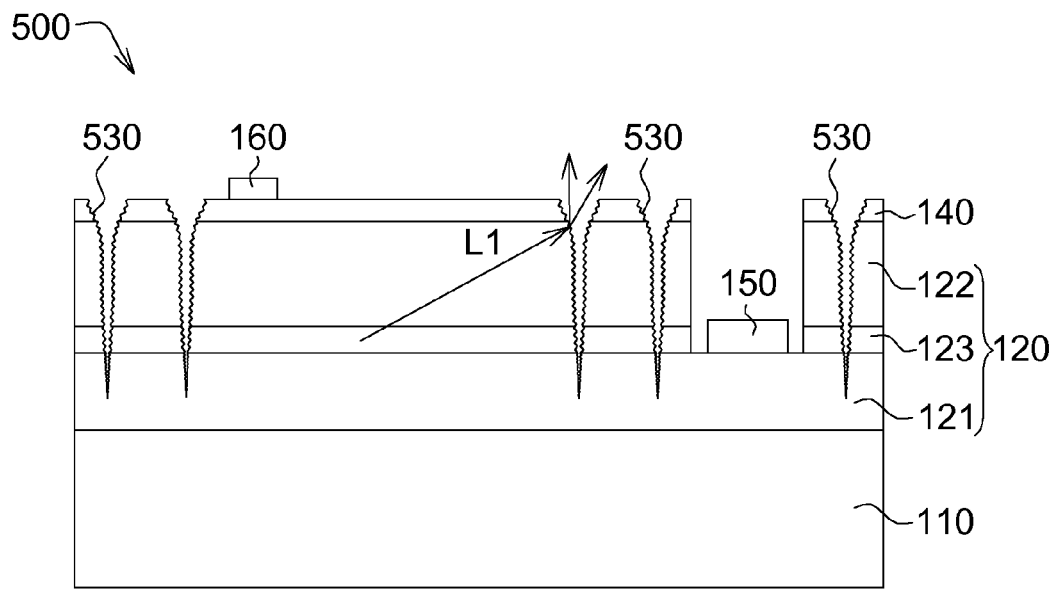
FIG. 7 is a sectional view of an LED element according to another embodiment.

FIG. 7 is a sectional view of an LED element according to an embodiment. An LED element 500 includes a substrate 110, a diode structure layer 120, a plurality of light-guide structures 530, a transparent electrode 140, a first electrode 150 and a second electrode 160. A structure of the light-guide structures 530 are similar to that of the light-guide structures 130 and shall be omitted herein.

In this embodiment, each of the light-guide structures 530 passes through the transparent electrode 140, a second semiconductor layer 122, an active layer 123 and a first semiconductor layer 121 to form a light-guide column slit. The guide-structures 530 are capable of diffusing a beam L1 entering from a side to a light-exiting side of the LED element 500. In this embodiment, the light-guide structures 530 are distributed at one edge of the LED element 500, and may be further arranged around the first electrode 150.

In this embodiment, the light-guide structures 530 thoroughly penetrate the transparent electrode 140, the second semiconductor layer 122 and the active layer 123, and pass a part of the first semiconductor layer 121 (not thoroughly penetrated through). In another embodiment, the light-guide structures 530 may penetrate through the entire diode structure layer 120 and a part of the substrate 110.

Figure 8:
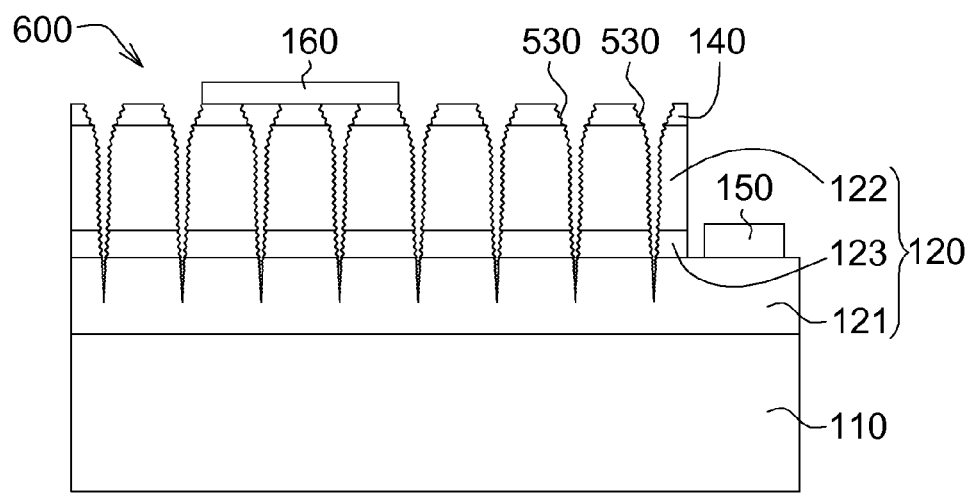
FIG. 8 is a sectional view of an LED element according to another embodiment.

FIG. 8 is a sectional view of an LED element according to another embodiment. An LED element 600 includes a substrate 110, a diode structure layer 120, a plurality of light-guide structures 530, a transparent electrode 140, a first electrode 150 and a second electrode 160. In this embodiment, the light-guide structures 530 are evenly distributed in the LED element 500. For example, a gap between two neighboring light-guide structures 530 is substantially equal or has a small tolerable range. Further, the second electrode 160 may shield openings of the light-guide structures 530.

A method for manufacturing and equipment for forming the light-guide structures 130 shall be described below.

FIG. 9 is equipment for forming light-guide structures of an LED element according to an embodiment.

The forming equipment is applicable to an LED element to form a plurality of light-guide structures. In this embodiment, forming equipment 1000 includes a laser source 1100, at least one focusing lens structure 1200 and a wave plate 1300. The focusing lens structure 1200 is disposed in an accommodating element 1700.

A laser beam L2 transmitted by the laser source 1100, after passing through the wave plate 1300 and the focusing lens structure 1200, enters at least one of the substrate 110, the diode structure layer 120 and the transparent electrode 140. In an embodiment, to form the light-guide structures 130 on the substrate 110, the light-guide structures 130 are directly formed on the substrate 110 by use of the forming equipment 1000 after providing the substrate 110, followed by forming the diode structure layer 120. In another embodiment, to form the light-guide structures 130 on the diode structure layer 120, after forming at least one of the diode structure layer 120 on the substrate 110, the light-guide structures 130 are directly formed on the diode structure layer 120 by use of the forming equipment 1000.

Further, the opening diameter D1 (FIG. 3) and the depth H1 (FIG. 3) of the light-guide structures 130 may be determined by emission time and energy of the laser beam L2.

Further, the forming equipment 1000 further includes a stage device 1400, a control unit 1500, an energy controller 1600 and a vacuum suction device 1800.

For example, the control unit 1500 is a single-chip micro computer, also referred to as microcontroller, or is a microcontroller that integrates a central processor, a memory, a timer/counter and various IO interfaces to an integrated circuit.

The control unit 1500 controls movements of the stage device 1400. The energy controller 1600 controls energy of the laser beam L2 emitted to the wave plate 1300. The vacuum suction device 1800 is steadily engaged to the LED element 100 through suction.

In this embodiment, for example, the wave plate 1300 is a quarter-wave plate, such that a laser beam L becomes circularly polarized light or elliptically polarized light after passing through the wave plate 1300 to form the light-guide structures 130 having the spiral slits 132. A wave plate capable of generating circularly polarized light or elliptically polarized light may be implemented as the wave plate in this embodiment.

Figure 10:
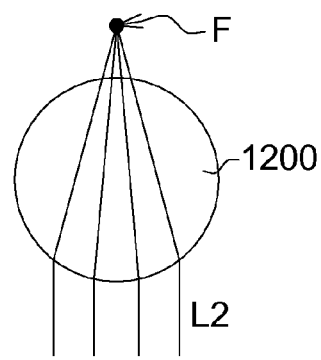
FIG. 10 is a schematic diagram of a focusing process of the laser beam in FIG. 9 passed through the focusing lens structure.

FIG. 10 is a schematic diagram of a focusing process of the laser beam in FIG. 9 passed through the focusing lens structure. After passing through the focusing lens structure 1200, the laser beam L2 focuses at an outer side of the focusing lens structure 1200, i.e., a focal point F falls at the outer side of the focal lens structure 1200. In an embodiment, the focal point F falls on the LED element 100 (FIG. 9), so that energy of the laser beam L2 is concentrated at the LED element 100 to effectively form the light-guide structures 130.

Through selecting the focusing lens structure 1200 having an appropriate refractive index and the laser beam L2 having an appropriate wavelength, the laser beam L2 is able to focus at the outer side of the focusing lens structure 1200 after passing through the focusing lens structure 1200, thereby preventing the energy of the laser beam L2 from immoderately focusing in the focusing lens structure 1200 and damaging (burning) the focusing lens structure 1200.

In an embodiment, the energy intensity of the laser beam L2 may be smaller than 20 joules per $cm^2$ to prevent the excessive energy from damaging the focusing lens structure 1200. The wavelength of the laser beam L2 is greater than 500 nm, and is approximately 800 nm in an embodiment, for example. In another embodiment, the laser beam L2 is a nanosecond laser, and the laser source 1100 is correspondingly a nanosecond laser transmitter. Compared to a laser beam having a shorter wavelength, the laser beam L2 having a longer wavelength in this embodiment is less prone to diffusion. Thus, the laser beam L2 having a longer wavelength in this embodiment is able to focus at the outer side of the focusing lens structure 1200, so as to prevent the laser L2 from focusing in the focusing lens structure 1200 and damaging the focusing lens structure 1200.

For example, the focusing lens structure 1200 is a high focusing lens structure, i.e., a curvature radius R1 of the focusing lens structure 1200 may be between 2.5 μm to 2500 μm. Thus, the laser beam L2 is able to focus with the aid of the focusing lens structure 1200, such that even the laser beam L2 with minute energy can focus through the focusing lens structure 1200 to achieve laser processing. By use of more than two focusing lens structures 1200, the forming equipment 1000 may achieve multi-point laser processing.

In this embodiment, a refractive index of the focusing lens structure 1200 is approximately between 1.1 and 2.5. Due to the low refractive index of the focusing lens structure 1200, a deflection angle of a laser beam entering the focusing lens structure 1200 may be reduced in a way that the focal point F falls at the outer side of the focusing lens structure 1200, thereby preventing the laser from focusing in the focusing lens structure 1200 and damaging the focusing lens structure 1200.

FIGS. 11A to 11E are sectional views of a focusing lens structure according to several embodiments.

Figure 11A:
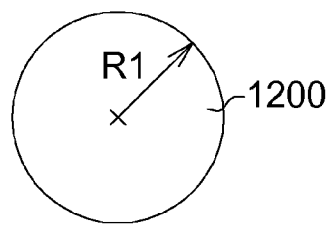
FIGS. 11A to 11E are sectional views of a focusing lens structure according to several embodiments.

Referring to FIG. 11A, the focusing lens structure 1200 is a focusing lens sphere, which has a curvature diameter R1 ranging between 2.5 μm and 2500 μm.

Figure 11B:
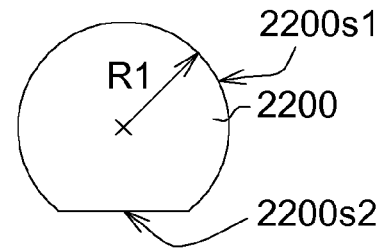

Referring to FIG. 11B, a focusing lens structure 2200 has a light-exiting curve surface 2200s1 and a flat surface 2200s2. For example, the light-exiting curve surface 2200s1 is a spherical curve surface having a curvature radius R1 ranging between 2.5 μm and 2500 μm. The focusing lens structure 2200 is disposed on the accommodating element 1700 via the flat surface 2200s2 to be steadily engaged on the accommodating element 1700. The light-exiting curve surface 2200s1 faces towards the stage device 1400 (FIG. 9), so that the laser beam L2 exits from the light-exiting surface 2200s1 to enter the LED element 100 (FIG. 9). In this embodiment, for example, a radius (not shown) of the flat surface 2200s2 is smaller than the curvature radius R1 of the light-exiting curve surface 2200s1.

Figure 11C:
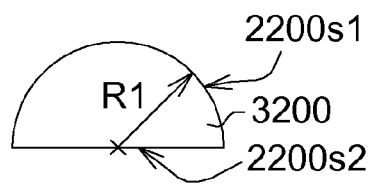

Referring to FIG. 11C, a focusing lens structure 3200 is a focusing lens semi-sphere having a light-exiting curve surface 2200s1 and a flat surface 2200s2. The laser beam L2 exits from the light-exiting curve surface 2200s1 to enter the LED element 100. In this embodiment, for example, a radius (not shown) of the flat surface 2200s2 equals the curvature radius R1 of the light-exiting curve surface 2200s1.

Figure 11D:
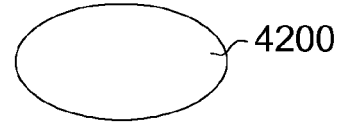

Referring to FIG. 11D, a focusing lens structure 4200 is a focusing lens ellipsoidal sphere. An incident direction of the laser beam L2 entering the focusing lens ellipsoidal sphere 4200 is substantially parallel to a short axis of the focusing lens ellipsoidal sphere 4200.

Figure 11E:
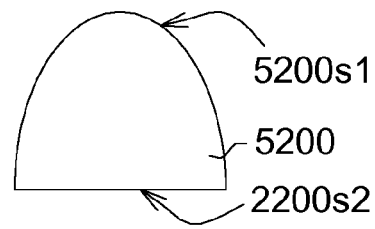

Referring to FIG. 11E, a focusing lens structure 5200 is a focusing lens ellipsoidal sphere having a light-exiting curve surface 5200s1 and a flat surface 2200s2. The laser beam L2 exits from the light-exiting curve surface 5200s1 to enter the LED element 100.

FIGS. 12A to 12D are top views of focusing lens structures in an array arrangement according to several embodiments.

Figure 12A:
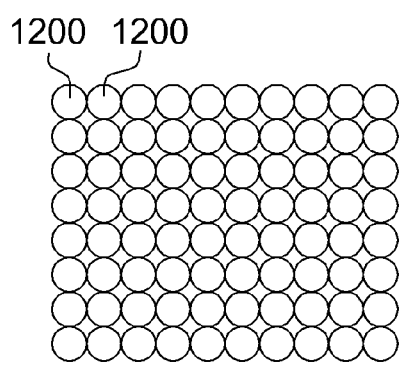
FIGS. 12A to 12D are top views of focusing lens structures in an array arrangement according to several embodiments.

Referring to FIG. 12A, a plurality of focusing lens structures 1200 are arranged in an array. The focusing lens structures 1200 are same-sized. Two neighboring focusing lens structures 1200 are located closely to each other to prevent the focusing lens structures 1200 from wavering.

Figure 12B:
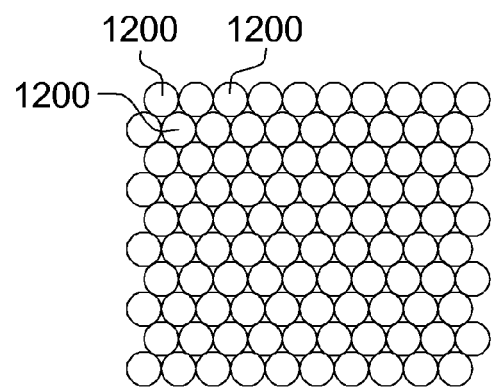

Referring to FIG. 12B, a gap between two neighboring focusing lens structures 1200 in FIG. 12A is placed with another focusing lens structure 1200. Compared to the focusing lens structures 1200 in FIG. 12A, the number of the focusing lens structures 1200 in this embodiment is larger than that in FIG. 12A, and a space between two neighboring focusing lens structures 1200 is even smaller.

Figure 12C:
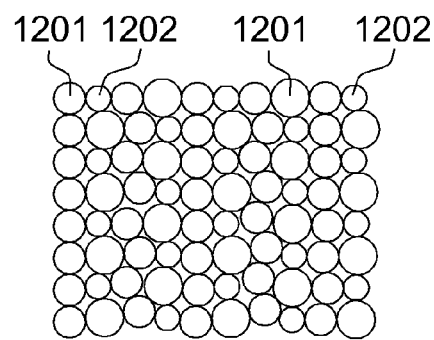

Referring to FIG. 12C, a plurality of focusing lens structures 1200 are arranged in an array. The focusing lens structures 1200 are differently-sized. That is to say, focusing lens structures 1201 are greater in size than focusing lens structures 1202.

Figure 12D:
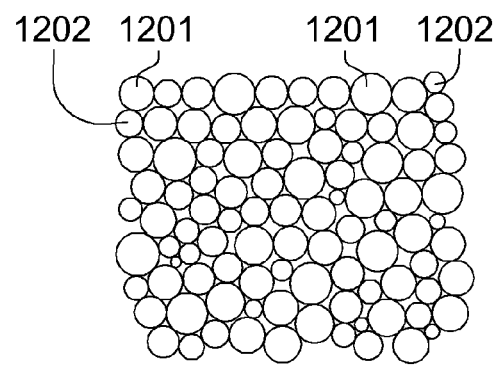

Referring to FIG. 12D, a plurality of focusing lens structures 1200 are arranged in an irregular arrangement (irregular relative to an array arrangement). The focusing lens structures 1200 are different-sized. That is to say, focusing lens structures 1201 are greater in size than focusing lens structures 1202.

FIGS. 13A to 13E are forming processes of light-guide structures according to an embodiment.

Figure 13A:
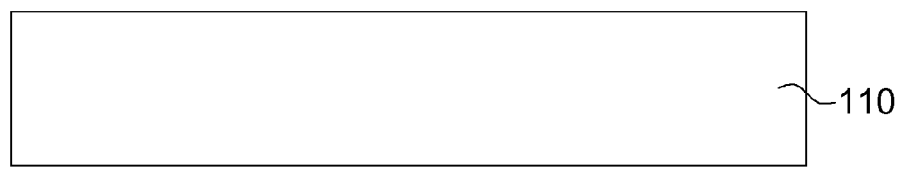
FIGS. 13A to 13E are forming processes of light-guide structures of an LED element according to one embodiment.

Referring to FIG. 13A, a substrate 110 is provided.

Figure 13B:
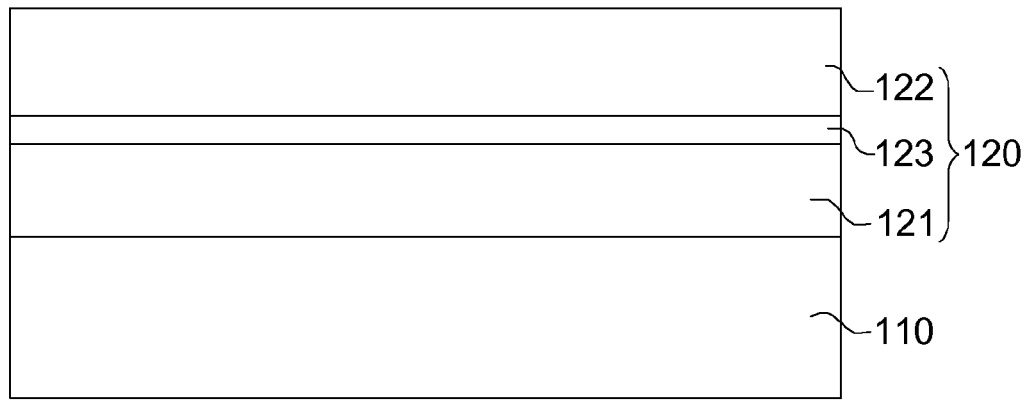

Referring to FIG. 13B, a diode structure layer 120 is formed on the substrate 110, e.g., by deposition. More specifically, a first semiconductor layer 121 is formed on the substrate 110, an active layer 123 is formed on the first semiconductor layer 121, and a second semiconductor layer 122 is formed on the active layer 123.

Figure 13C:
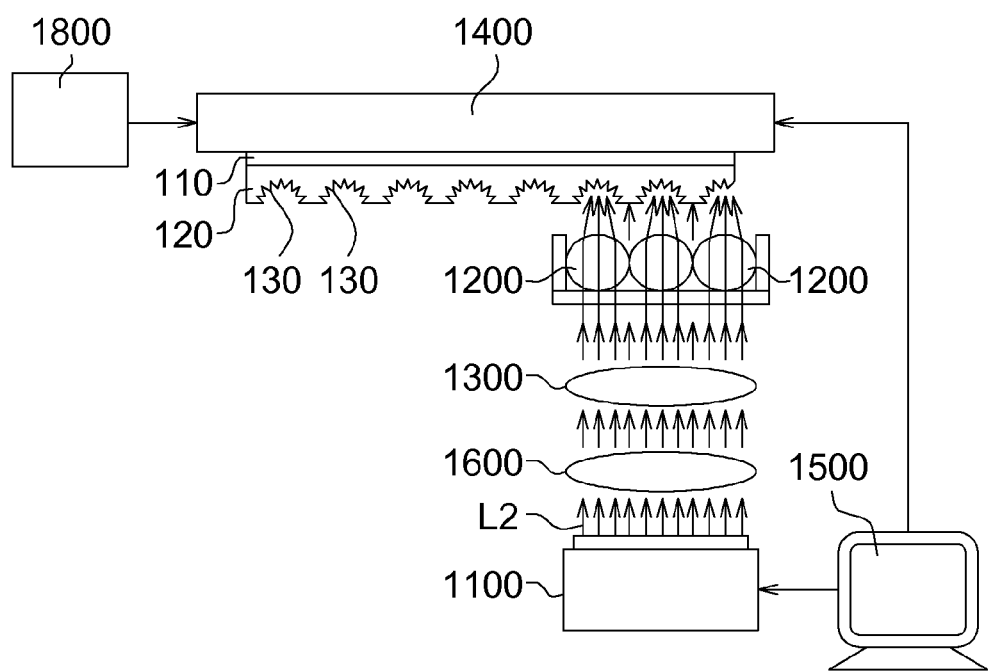

Referring to FIG. 13C, the substrate 110 and the diode structure layer 120 are disposed on a stage device 1400 of a forming equipment 1000.

Referring to FIG. 13C, a laser beam L2 is transmitted by a laser source 1100. The laser beam L2 passes through a wave plate 1300 and a focusing lens structure 1200 and enters the semiconductor layer 122 (not shown in FIG. 13C) of the diode structure layer 120, so as to form light-guide structures 130 on the second semiconductor layer 122.

In the process of forming the light-guide structures 130, the stage device 1400 may be at the same time moved so as to allow the laser beam L2 to pass through a predetermined area of the diode structure layer 120 and form the plurality of light-guide structures 130 in the predetermined area.

Figure 13D:
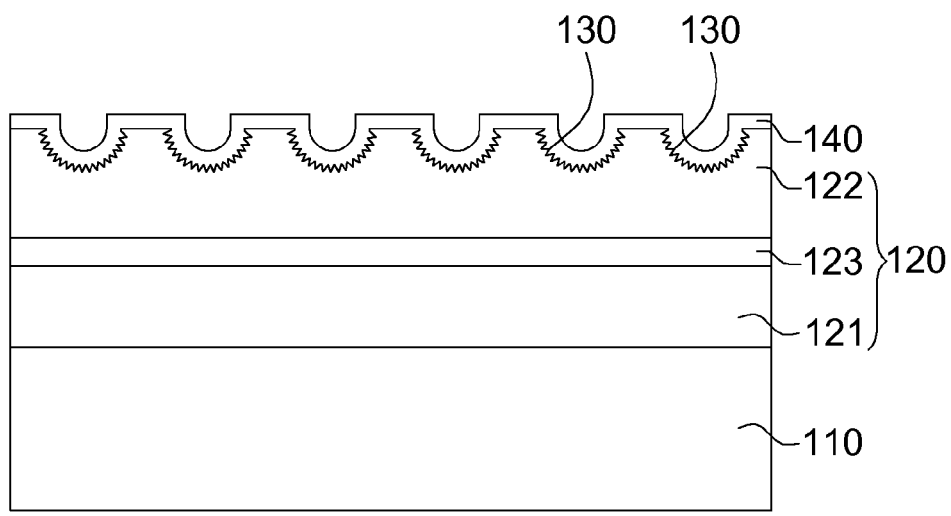

Referring to FIG. 13D, a transparent electrode 140 is formed on the diode structure layer 120, e.g., by deposition. The transparent electrode 140 covers the light-guide structures 130.

Figure 13E:
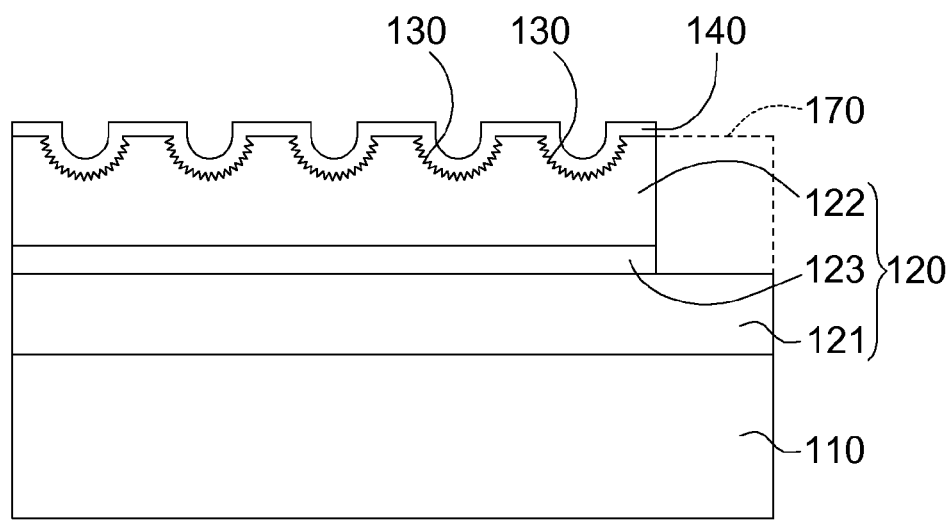

Referring to FIG. 13E, an opening 170 is formed at the diode structure layer 120, e.g., by etching, to reveal a part of the first semiconductor layer 121.

A first electrode 150 as shown in FIG. 1 is formed on the first semiconductor layer 121, and a second electrode 160 as shown in FIG. 1 is formed on the transparent electrode 140. Thus, at least one LED element 100 as shown in FIG. 1 is formed.

In the forming process of the light-guide structures 130 in FIG. 4, the substrate 110 is disposed on the stage device 1400. From the laser source 1100, the laser beam L2 is transmitted to pass through the wave plate 1300 and the focusing lens structures 1200 to enter the substrate 110, thereby forming the light-guide structures 130 in FIG. 4 on the substrate 110. The diode structure layer 120 is then formed on the substrate 110.

In the forming process of the light-guide structures 130 in FIG. 5, the substrate 110 and the first semiconductor layer 121 are disposed on the stage device 1400 after forming the first semiconductor layer 121 of the diode structure layer 120. From the laser source 1100, the laser beam L2 is transmitted to pass through the wave plate 1300 and the focusing lens structures 1200 to enter the first semiconductor layer 121, thereby forming the light-guide structures 130 in FIG. 5 on the first semiconductor layer 121. The active layer 123, the second semiconductor layer 122 and the transparent electrode 140 are then formed.

In the forming process of the light-guide structures 130 in FIG. 6, the substrate 110, the diode structure layer 120 and the transparent electrode 140 are disposed on the stage device 1400 after forming the transparent electrode 140 on the diode structure layer 120. From the laser source 1100, the laser beam L2 is transmitted to pass through the wave plate 1300 and the focusing lens structures 1200 to enter the transparent electrode 1400, thereby forming the light-guide structures 1300 in FIG. 6 on the transparent electrode 140.

Further, by appropriately controlling parameters (e.g., intensity and time) of the laser beam L2, the light-guide structures 130 may penetrate at least one of the first semiconductor layer 121, the active layer 123 and the second semiconductor layer 122, with details thereof to be described below.

In the forming process of the light-guide structures 130 in FIG. 7, after forming the diode structure layer 120 on the substrate 110, at a corresponding edge of the LED element 500, the light-guide structures 530 are formed to penetrate the second semiconductor layer 122 and the active layer 123 as well as a part of the first semiconductor layer 121, so as to form each of the light-guide structures 130 as a light-guide column slit, as shown in FIG. 7. In another embodiment, the light-guide structures 530 may penetrate the entire diode structure layer 120 and a part of the substrate 110.

In the forming process of the light-guide structures 530 in FIG. 8, after forming the transparent electrode 140 on the substrate 110, the light-guide structures 530 are evenly formed to penetrate the transparent electrode 140, the second semiconductor layer 122, the active layer 123 and a part of the semiconductor layer 121, so as to form each of the light-guide structures 530 as a light-guide column slit, as shown in FIG. 8.

In the forming process of the light-guide structures 130 and 530, without implementing a mask, at least one of the light-guide structures 130 and 530 may be formed by controlling a movement range of the stage device 1400. By controlling a relative speed of the stage device 1400 and the laser source 1100, the size of the focusing lens structure 1200 (as in FIGS. 11A to 11E), the distribution of the focusing lens structures 1200 (as in FIGS. 12A to 12D) and/or the parameters (energy and time) of the laser beam L2, geometric characteristics (position, depth, diameter and/or arrangement) of the light-guide structures 130 and 530 may be controlled, with details thereof to be described below with reference to FIGS. 14A to 14D.

FIGS. 14A to 14D are sectional views of light-guide structures according to several embodiment of the present invention.

Figure 14A:
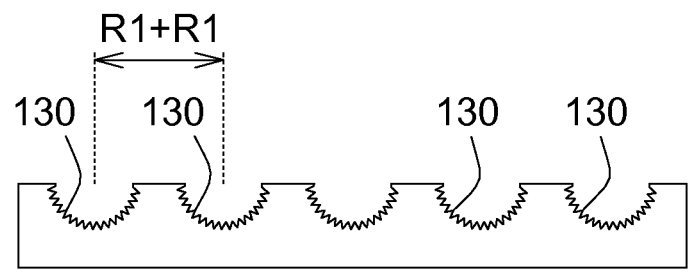
FIGS. 14A to 14D are sectional views of focusing lens structures according to several embodiments.

Referring to FIG. 14A, the light-guide structures 130 in FIG. 14A may be formed by use of the focusing lens structures 1200 in FIG. 12A or 12B. A gap between two neighboring light-guide structures 1200 is substantially equal to a sum of the curvature radiuses of the two corresponding focusing lens structures 1200, e.g., the gap equals R1+R1. In FIG. 14A, a same light-guide structure 130 is formed by one laser process.

Figure 14B:
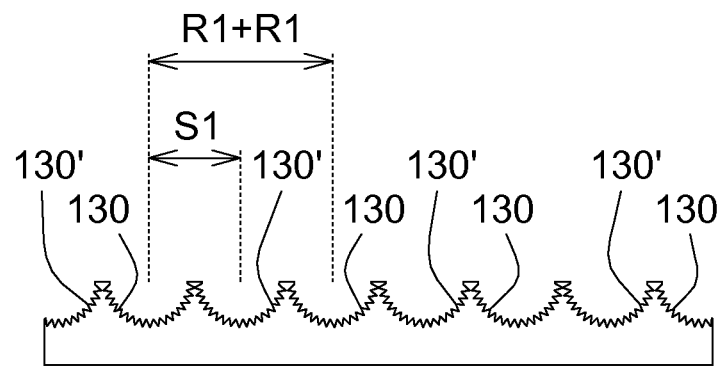

Referring to FIG. 14B, after forming the light-guide structures 130 in FIG. 14A, light-guide structures 130' are formed after moving the stage device 1400 by a distance S1. A gap between two neighboring light-guide structures 130 and 130' (the light-guide structures 130 and 130' are formed by two different laser processes) is substantially equal to the distance S1. In FIG. 14B, a same light-guide structure 130 may undergo a second laser process. For example, during the forming process of the light-guide structure 130', the light-guide structure 130 may be again processed by the laser beam L2. In another embodiment, by appropriately controlling process parameters, the light-guide structures 130 are only processed once by the laser beam L2.

Figure 14C:

Referring to FIG. 14C, the light-guide structures 130 in FIG. 14A may be formed by use of the focusing lens structures 1200 in FIG. 12A, 12B, 12C or 12D. With respect to controlling the stage device 1400, the stage device 1400 may be moved by small distances relative to the laser beam L2 to form a plurality of irregularly-shaped light-guide structures 130" in an irregular arrangement. In FIG. 14C, a same light-guide structure 130" may undergo two or more laser processes.

Figure 14D:
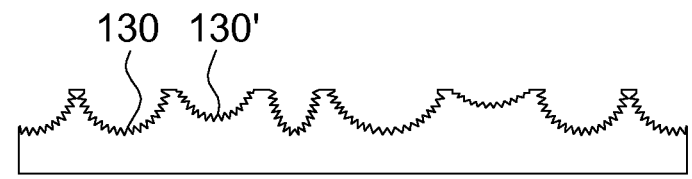

Referring to FIG. 14D, the light-guide structures 130 and 130' in FIG. 14D may be formed by use of the focusing lens structures 1200 in FIG. 12A, 12B, 12C or 12D. For example, the light-guide structures 130 are formed by the focusing lens structures 1201 in FIGS. 12C or 12D, and the light-guide structures 130' are formed by the focusing lens structures 1202. Alternatively, the light-guide structures 130 and 130' are formed by the focusing lens structures 1200 in FIGS. 12A or 12B, with energy of the laser beam for forming the light-guide structures 130 being stronger than that for forming the light-guide structures 130', such that the light-guide structures 130 are formed with a greater depth.

Figure 15:
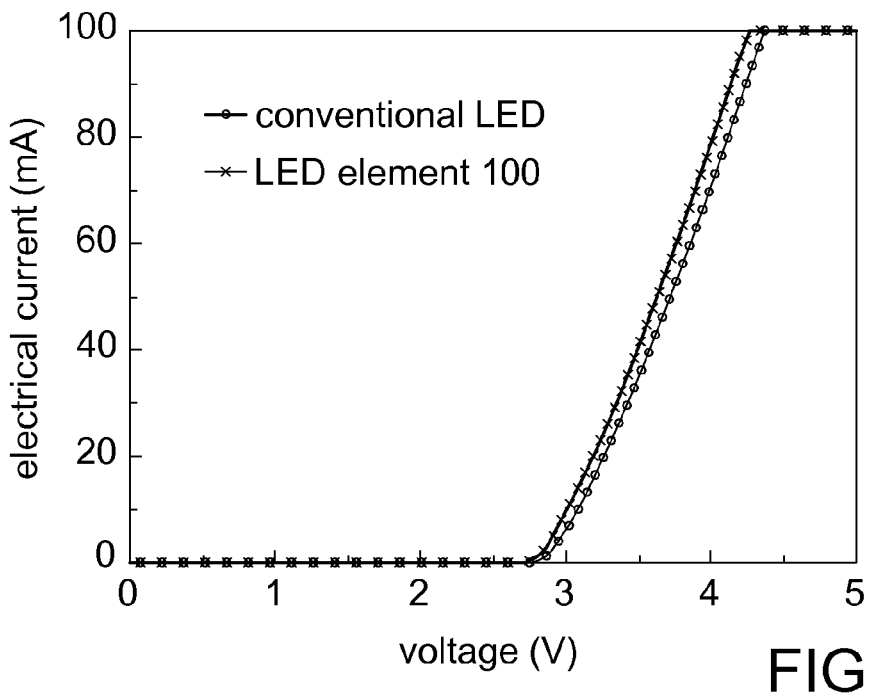
FIG. 15 is a diagram of test results of an LED element according to one embodiment.

FIG. 15 is a diagram of test results of an LED element according to an embodiment. Taking the LED element 100 for example, it is observed from the curve diagram of a current I versus a voltage V that, the forward voltage obtained when the current I of the LED element 100 is 20 mA is approximately 3.26V, which approximates a forward voltage of 3.20V under a same current I of 20 mA for a conventional LED. Therefore, it is apparent that the forward voltage of the LED element 100 having the light-guide structures 130 formed by laser is maintained at a normal level.

Figure 16:
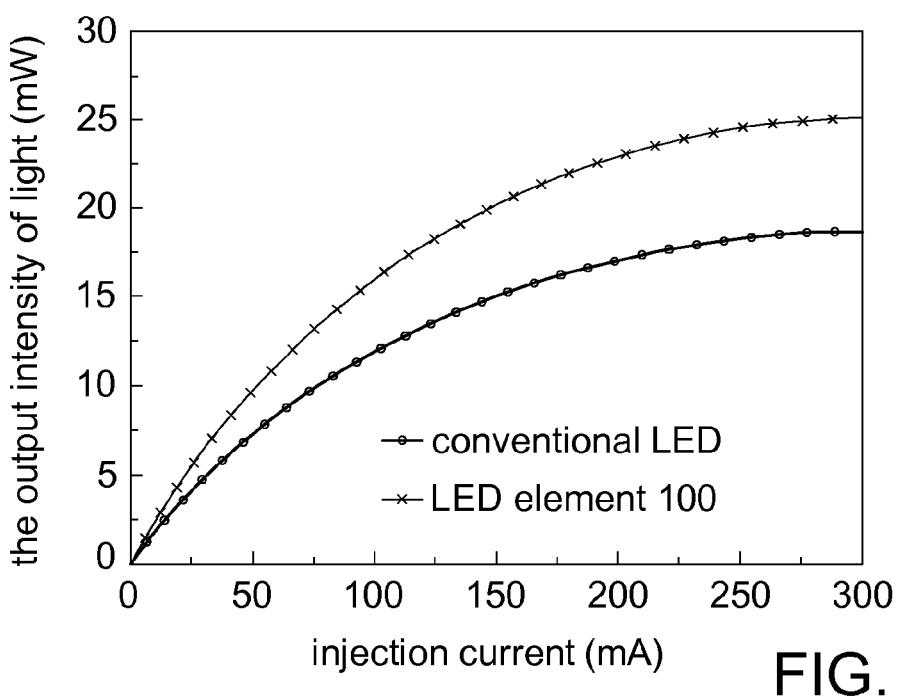
FIG. 16 is a diagram of test results of an LED element according to one embodiment.

FIG. 16 is a diagram of test results of an LED element according to an embodiment. Taking the LED element 100 for example, it is observed from the curve diagram of an output intensity E of light versus an injection current I that, the output intensity E of the LED element 100 is noticeably larger than the output intensity E for a conventional LED. Further, compared to the output intensity E of light of a conventional LED, the output intensity E of light obtained when the current I of the LED element 100 of the embodiment is 20 mA is increased, e.g., the light intensity at the same level of current is increased for about 33%.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light-emitting diode (LED) element, comprising:
 a substrate;
 a diode structure layer, formed on the substrate; and
 a plurality of light-guide structures, formed on at least one of the substrate and the diode structure layer, each of the light-guide structures having an inner wall and a plurality of spiral slits, the spiral slits being formed on the inner sidewall.

2. The LED element according to claim 1, wherein the diode structure layer comprises:
 a first semiconductor layer, formed on the substrate, being one of a P-type semiconductor and an N-type semiconductor;
 a second semiconductor layer, being the other of the P-type semiconductor and the N-type semiconductor; and
 an active layer, formed between the first semiconductor layer and the second semiconductor layer;
 wherein, the light-guide structures are formed on at least one of the substrate, the first semiconductor layer, the second semiconductor layer and the active layer.

3. The LED element according to claim 1, wherein each of the light-guide structures is a recess, and has a opening diameter ranging between 0.25 μm and 500 μm and a depth ranging between 10 nm and 1000 nm.

4. The LED element according to claim 1, wherein a period of the spiral slits ranges between 50 nm and 1000 nm.

5. The LED element according to claim 1, further comprising:
 a transparent electrode, formed on the diode structure layer;

wherein, the light-guide structures are formed on at least one of the substrate, the diode structure layer and the transparent electrode.

6. A method for manufacturing a light-guide structure of an LED element, comprising:
   providing a substrate;
   forming a diode structure layer on the substrate;
   disposing the substrate on a forming equipment, wherein the forming equipment comprises a laser source, a focusing lens structure and a wave plate, and the wave plate is disposed between the laser source and the focusing lens structure; and
   transmitting a laser beam by the laser source, wherein, the laser beam enters at least one of the substrate and the diode structure layer after passing through the wave plate and the focusing lens structure to form a plurality of light-guide structures, each of the light-guide structures has an inner sidewall and a plurality of spiral slits, and the spiral slits are formed on the inner sidewall.

7. The method according to claim 6, wherein in the step of transmitting the laser beam by the laser source, the laser beam enters the substrate after passing through the wave plate and the focusing lens structure to form the light-guide structures; and the step of forming the diode structure layer on the substrate further comprises forming the diode structure layer on the substrate layer, the diode structure layer covering the light-guide structures.

8. The method according to claim 6, wherein the step of disposing the substrate on the forming equipment is performed after the step of forming the diode structure layer on the substrate; and in the step of transmitting the laser beam by the laser source, the laser beam enters the diode structure layer after passing through the wave plate and the focusing lens structure to form the light-guide structures.

9. The method according to claim 6, wherein the step of forming the diode structure layer on the substrate comprises:
   forming a first semiconductor layer on the substrate;
   forming an active layer on the first semiconductor layer; and
   forming a second semiconductor layer on the active layer;
   wherein the first semiconductor layer is one of a P-type semiconductor and an N-type semiconductor, and a second semiconductor layer is the other of the P-type semiconductor and the N-type semiconductor; and
   the step of transmitting the laser beam by the laser source comprises forming the light-guide structures on at least one of the first semiconductor layer, the active layer and the second semiconductor layer.

10. The method according to claim 6, further comprising:
    forming a transparent electrode on the diode structure layer;
    in the step of transmitting the laser beam by the laser source, the laser beam enters at least one of the substrate, the diode structure layer and the transparent electrode to form the light-guide structures.

11. The method according to claim 6, wherein each of the light-guide structures is a recess, and has an opening diameter ranging between 0.25 μm and 500 μm and a depth ranging between 10 nm and 1000 nm.

12. The method according to claim 6, wherein a period of the spiral slits ranges between 50 nm and 1000 nm.

* * * * *